(12) United States Patent
Harrer et al.

(10) Patent No.: US 10,342,152 B2
(45) Date of Patent: Jul. 2, 2019

(54) ELECTRONIC DEVICE HAVING A HOUSING WITH A CIRCUIT BOARD PROVIDED THEREIN

(71) Applicant: CONTINENTAL AUTOMOTIVE GMBH, Hannover (DE)

(72) Inventors: Christian Harrer, Regensburg (DE); Andreas Bernhardt, Wenzenbach (DE)

(73) Assignee: Continental Automotive GmbH, Munich (DE)

( * ) Notice: Subject to any disclaimer, the term of this patent is extended or adjusted under 35 U.S.C. 154(b) by 0 days.

(21) Appl. No.: 15/906,394

(22) Filed: Feb. 27, 2018

(65) Prior Publication Data
US 2018/0255659 A1 Sep. 6, 2018

Related U.S. Application Data
(63) Continuation of application No. PCT/EP2016/069771, filed on Aug. 22, 2016.

(30) Foreign Application Priority Data
Aug. 27, 2015 (DE) .......... 10 2015 216 419

(51) Int. Cl.
*H05K 5/00* (2006.01)
*H05K 7/14* (2006.01)
(Continued)

(52) U.S. Cl.
CPC ......... *H05K 7/1427* (2013.01); *H05K 1/0204* (2013.01); *H05K 1/028* (2013.01);
(Continued)

(58) Field of Classification Search
CPC ...... H05K 1/0204; H05K 1/028; H05K 1/181; H05K 5/0039; H05K 7/1427; H05K 2201/056
(Continued)

(56) References Cited

U.S. PATENT DOCUMENTS 3,582,865 A * 6/1971 Franck ................ H05K 7/1007
361/702
5,959,844 A 9/1999 Simon et al.
(Continued)

FOREIGN PATENT DOCUMENTS

DE 3936906 A1 5/1991
DE 4332716 A1 3/1995
(Continued)

OTHER PUBLICATIONS

International Search Report and Written Opinion dated Oct. 27, 2016 from corresponding International Patent Application No. PCT/EP2016/069771.
(Continued)

*Primary Examiner* — Hung S. Bui

(57) ABSTRACT

The invention relates to an electronic device having a multi-part printed circuit board, the printed circuit board parts of which are connected to one another by current-carrying, flexible regions, having a support, around which the printed circuit board bent around the flexible regions of the printed circuit board is arranged and fixed, and having a housing in which the printed circuit board mounted on the support is fixed.

18 Claims, 3 Drawing Sheets

(51) Int. Cl.
*H05K 1/02* (2006.01)
*H05K 1/18* (2006.01)

(52) U.S. Cl.
CPC .......... *H05K 1/181* (2013.01); *H05K 5/0039* (2013.01); *H05K 2201/056* (2013.01); *H05K 2201/09009* (2013.01)

(58) Field of Classification Search
USPC ......................................... 361/728–730, 752
See application file for complete search history.

(56) References Cited

U.S. PATENT DOCUMENTS

| | | | |
|---|---|---|---|
| 6,778,389 B1 | 8/2004 | Glovatsky et al. | |
| 7,180,736 B2 * | 2/2007 | Glovatsky | H05K 7/1434 361/688 |
| 7,606,050 B2 * | 10/2009 | Cady | H05K 1/189 174/254 |
| 8,785,783 B2 | 7/2014 | Scharrer et al. | |
| 9,644,471 B2 * | 5/2017 | Logan | E21B 47/01 |

FOREIGN PATENT DOCUMENTS

| | | |
|---|---|---|
| DE | 4429983 C1 | 11/1995 |
| DE | 102004033401 A1 | 2/2005 |
| DE | 102008052243 A1 | 4/2010 |
| DE | 102013200635 A1 | 7/2014 |

OTHER PUBLICATIONS

German Office Action dated Aug. 30, 2016 for corresponding German Patent Application No. 10 2015 216 419.5.

* cited by examiner

ELECTRONIC DEVICE HAVING A HOUSING WITH A CIRCUIT BOARD PROVIDED THEREIN

CROSS REFERENCE TO RELATED APPLICATIONS

This application claims the benefit of PCT Application PCT/EP2016/069771, filed Aug. 22, 2016, which claims priority to German Patent Application 10 2015 216 419.5, filed Aug. 27, 2015. The disclosures of the above applications are incorporated herein by reference in their entirety.

BACKGROUND

Control devices for sequence control in vehicles, in particular motor control devices, are having to undertake ever more complex control tasks and therefore have an increasing number of electronic and electrical components that have to be arranged on printed circuit boards. In order to meet this requirement, there are, in addition to the use of a plurality of printed circuit boards that then have to be electrically connected to one another in a complex manner, multi-part printed circuit boards as well that are connected to one another by means of current-carrying, flexible regions produced, for example, by means of milling. This means simplification of the production process, since particularly the subsequent electrical connection of a plurality of printed circuit boards no longer applies.

However, since control devices in the automotive field are subjected to high mechanical loads, in particular vibrations, it is necessary to properly anchor the individual printed circuit board parts to the housing. At present, this is usually done by means of screws; however, this involves an increased level of production outlay. Moreover, on account of power electronics components and the significant heating associated therewith, good heat transfer from a printed circuit board part to the normally metallic housing, which functions as a heatsink, has to be provided.

DE 39 36 906 A1 discloses a printed circuit board composed of a plurality of printed circuit board parts, which are connected to one another by way of flexible regions by means of which the printed circuit board parts are pivoted by bending around the flexible regions several times in such a way that the two edge parts of the entire printed circuit board that are intended to receive plugs come to lie in the same plane. Two printed circuit board parts that are opposite one another by way of the multiple bending operations are adhesively bonded to a cover and to a base, respectively, of a housing receiving the printed circuit board, wherein the cover and the base are anchored in corresponding grooves of a circumferential housing frame part. In this way, although a multi-part printed circuit board can be properly coupled to the housing mechanically and thermally, the production is complex.

DE 10 2013 200 635 A1 likewise discloses a multi-part printed circuit board, in which further partial printed circuit boards are connected to a plurality of sides of a central partial printed circuit board by way of flexible regions, at which in turn further, smaller partial printed circuit boards are connected. By appropriately bending the flexible regions, the partial printed circuit boards are positioned such that all the partial printed circuit boards are arranged perpendicularly to the central partial printed circuit board and the smaller partial printed circuit boards come to lie next to one another, since they are fitted with plugs and are intended to be positioned in the opening of a housing. Although the partial printed circuit boards are pressed against an adjacent housing wall by the restoring force of the flexible regions when the printed circuit board is mounted in a housing, this is not sufficient to prevent the partial printed circuit boards from oscillating at vibrations as occur to a great extent in a motor vehicle, with the result that the partial printed circuit boards usually have to be screwed on.

The multi-part printed circuit boards of DE 39 36 906 A1 and DE 10 2013 200 635 A1 can, of course, be supplemented with further partial printed circuit boards such that a whole rectangular prism can be produced, for example, the side walls of which are formed by the partial printed circuit boards.

However, with increasing complexity of the multi-part printed circuit board, despite the advantages thereof, there is the problem of increasingly complex production of the final shape and the mounting thereof in a housing.

SUMMARY

It is therefore the object of the invention to design an electronic device in such a way that simple and cost-effective production and mounting are possible.

The electronic device having a multi-part printed circuit board, the printed circuit board parts of which are connected to one another by means of current-carrying, flexible regions, a support, around which the printed circuit board bent around the flexible regions of the printed circuit board is arranged and fixed, and a housing, in which the printed circuit board mounted on the support is fixed, is formed accordingly.

By way of the support, the final shape of the multi-part printed circuit board may be produced in a simple manner by folding the individual printed circuit board parts around the support and by fixing the printed circuit board parts to the support. It is finally possible to insert the entire "printed circuit board package" into the housing in a simple and cost-effective manner. The support may in this case be formed with bars, which are connected to one another by way of respective corner connectors.

In a refinement of an embodiment of the invention, the support has latching lugs for fixing the printed circuit board, in which latching lugs corresponding printed circuit board parts are latched.

The support is particularly advantageous when the multi-part printed circuit board is completely folded around the support, that is to say when the printed circuit board has at least five printed circuit board parts, which are arranged in a row, wherein, in the printed circuit board mounted on the support, the respective row end printed circuit board parts have a smaller width than the entire printed circuit board, wherein the sum of the row end printed circuit board part widths is not greater than the entire printed circuit board width, and the row end printed circuit board parts lie next to one another on the same support side. The row end printed circuit board parts may then be provided with plugs, wherein input signals are guided to the printed circuit board via the one plug and output signals are guided from the printed circuit board via the other plug and therefore only have to be guided in one direction by way of the printed circuit board, which leads to simplification of the cable routing.

In the case of closed shapes of this kind, the end shape may be produced in a particularly efficient manner by means of the support according to embodiments of the invention.

This also applies particularly for the case where the row end printed circuit board parts are fitted with contact plugs.

When the support and the housing interior taper in at least a cross-sectional plane in the direction of the housing interior, the printed circuit board package becomes wedged in the housing, with the result that the printed circuit board surfaces facing the housing walls are in good thermal contact with the housing walls for cooling purposes.

In a development, a highly thermally conductive compound is arranged between a housing wall and a surface of a printed circuit board part that faces the housing wall.

Both sides of the printed circuit board parts may be populated, wherein very flat components are fastened to the printed circuit board surfaces adjacent to the housing walls, whereas components of higher design, such as capacitors or coils, for example, are fastened to the printed circuit board surface thereof facing the housing interior side.

When a printed circuit board part is arranged on the support on the side opposite the housing opening, at least one component may be advantageously fastened to the printed circuit board part, the component protruding into a cavity in the housing in order to be better cooled.

BRIEF DESCRIPTION OF THE DRAWINGS

The invention is intended to be described in more detail below with reference to an exemplary embodiment with the aid of figures. In the figures.

DETAILED DESCRIPTION

Figure 1:
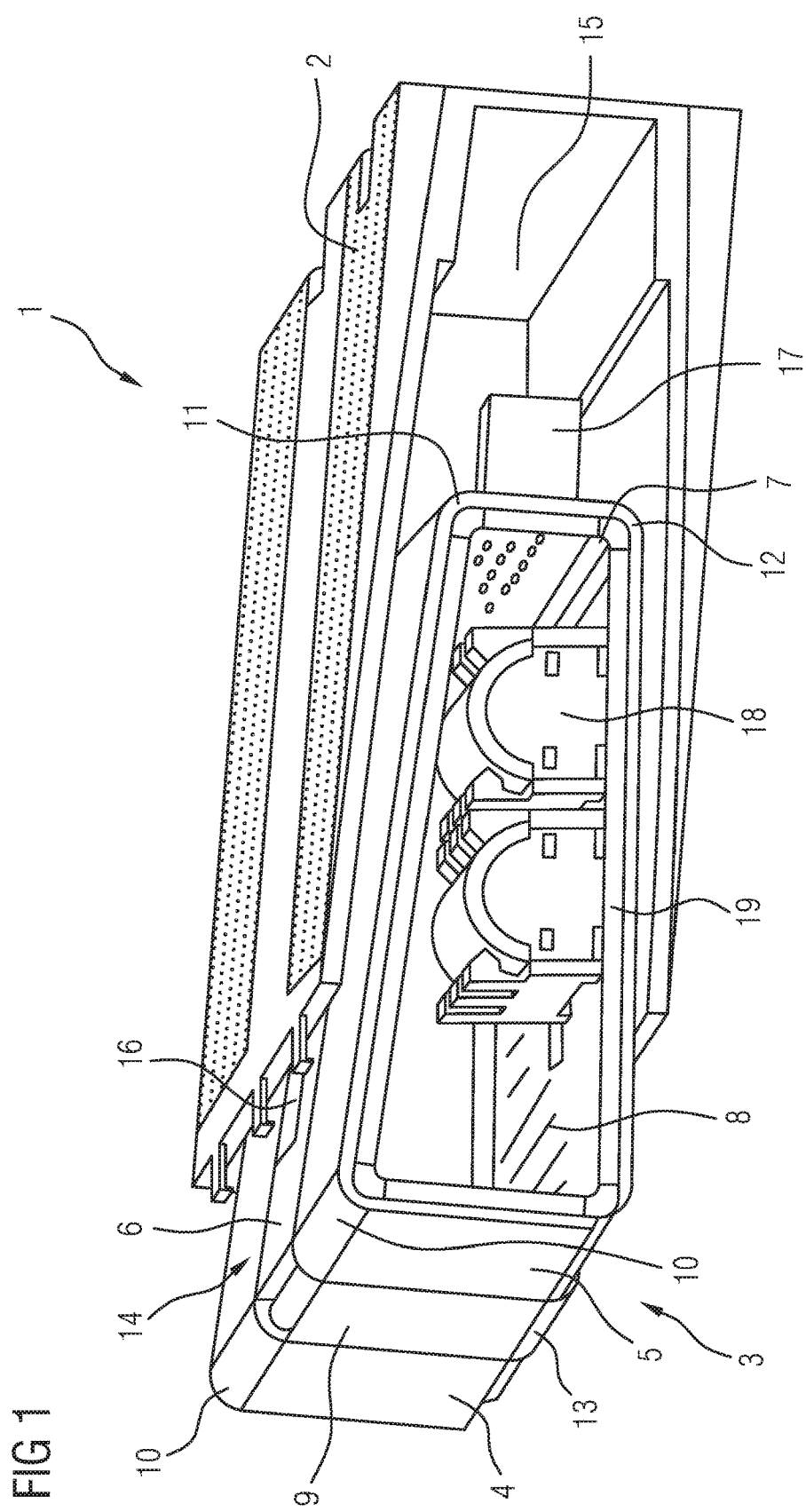
FIG. 1 shows an electronic device according to an embodiment of the invention having a support.

FIG. 1 shows a perspective illustration of an electronic device 1 according to an embodiment of the invention, in which a multi-part printed circuit board 3 is mounted in a housing 2 with the aid of a support 19. The support 19 is in this case formed with bars, which are connected to one another by means of corner connection parts and form the edges of a body having an approximately trapezoidal cross section. In the illustrated embodiment of FIG. 1, the side faces run approximately parallel to one another; however, in principle, respectively opposite side faces may also be arranged at an angle to one another.

In the illustrated embodiment, the multi-part printed circuit board 3 is folded with the printed circuit board parts 4-9 thereof around the support 19 in such a way that two opposite sides of the support 19 are not covered with printed circuit board parts. The edge elements of the multi-part printed circuit board 3 are designed as smaller printed circuit board parts 4, 5 and 9, wherein the two printed circuit board parts 4 and 5 on one edge of the multi-part printed circuit board 3 and the printed circuit board part 9 on the other edge of the multi-part printed circuit board 3 are connected by means of a respective flexible region. By folding around the support 19, the small printed circuit board parts 4, 5 and 9 come to lie on the same side of the support 19 and substantially cover the side by interlocking. After the insertion of the support 19 provided with the printed circuit board 3 into the housing 2, the smaller printed circuit board parts 4, 5 and 9 are arranged in the opening of the housing 2 and may advantageously be provided with plugs, which are provided for input and output signals where necessary or are designed for high currents.

In the illustrated embodiment of FIG. 1, the housing interior is designed in a manner tapering toward the housing base and is adjusted to the trapezoidal cross section of the support 19, with the result that, during insertion of the support 19 provided with the printed circuit board 3 into the housing 2, the printed circuit board parts are pressed against the housing walls.

The surfaces of the corresponding printed circuit board parts 6 and 7 and possibly also the printed circuit board part 8 facing the housing walls may advantageously be provided with a highly thermally conductive compound, with the result that the heat generated by the power components may be properly dissipated to the metallic housing 2.

In an embodiment of the electronic device 1, at least one component 17 of higher design is provided at the printed circuit board part 8, which faces the base of the housing 2, the component of higher design being inserted into a cavity of the housing in order to be able to be cooled particularly well there. The individual printed circuit board parts 4-9 are connected to one another by means of flexible regions 10-13, wherein the flexible regions 10-13 may be produced, for example, by means of deep milling from a previously continuous printed circuit board. The flexible regions 10-13, which, on the one hand, serve for signal transmission between the individual printed circuit board parts 4-9, may, on the other hand, however, also be designed for carrying relatively high currents.

Both sides of the multi-part printed circuit board 3 may be populated with electrical and/or electronic components, wherein flat components 16, which possibly have to be properly cooled, are arranged on the surfaces of the printed circuit board parts 4-9 facing the housing walls, whereas larger components 18, such as electrolytic capacitors or even coils, for example, are arranged on the surface of a printed circuit board part 4-9 facing the housing interior.

Figure 2:
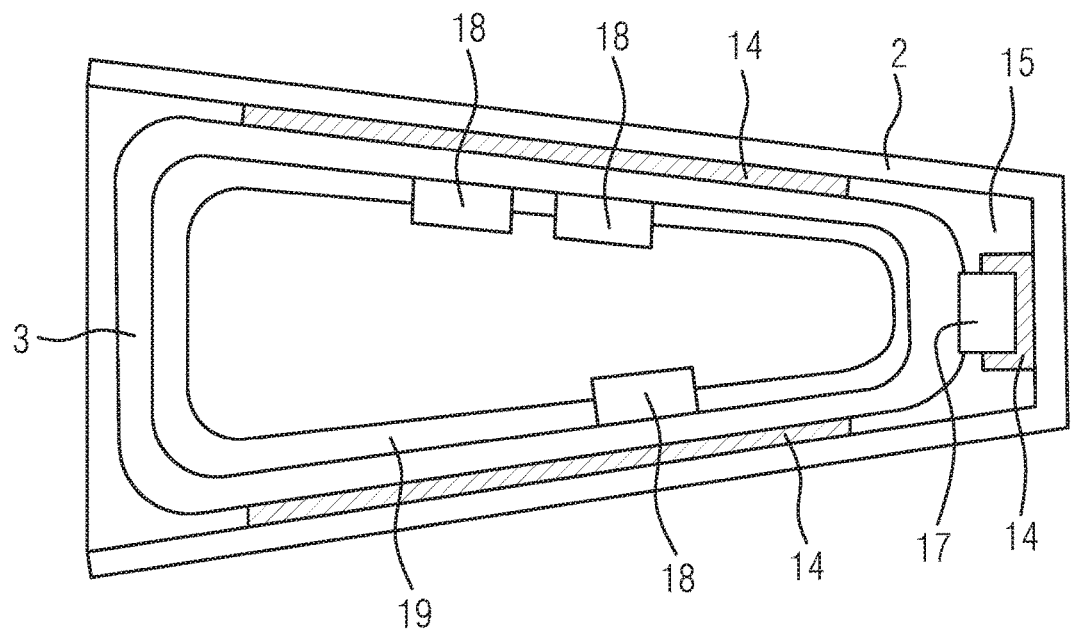
FIG. 2 shows the electronic device according to the embodiment of the invention in a cross-sectional illustration.

FIG. 2 shows a cross-sectional illustration of an electronic housing having an inserted support with printed circuit board 3 mounted thereon and illustrates the possibility of arranging a component 17 in a housing cavity 15.

Figure 3:
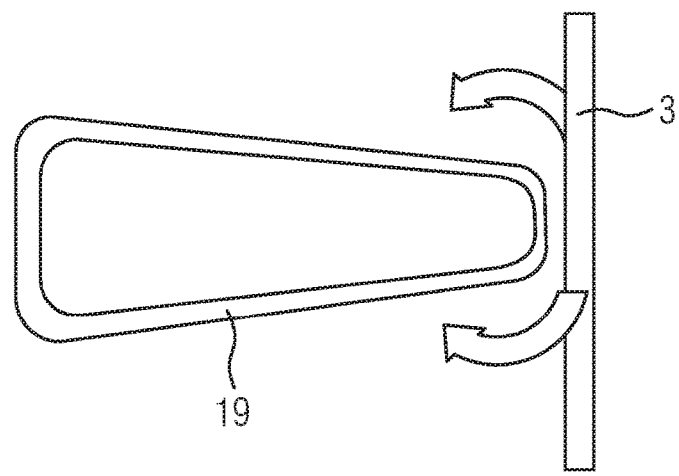
FIGS. 3 and 4 show the schematic illustration of the production of an electronic device according to an embodiment of the invention.
Figure 4:
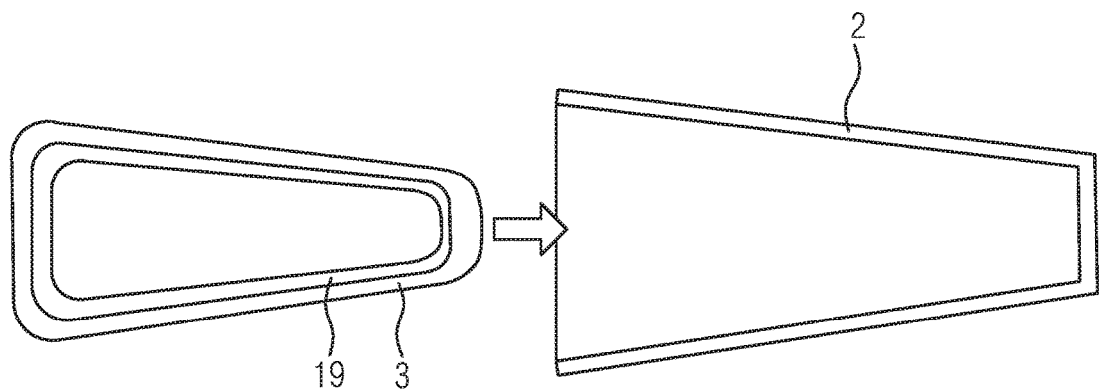

FIGS. 3 and 4 schematically illustrate the production process. Thus, firstly, a multi-part printed circuit board 3 is folded around the support 19, wherein this may take place not just in one plane but also in several planes, for example, using a printed circuit board in accordance with DE 10 2013 200 635 A1. The "printed circuit board package" obtained in this way is then inserted into a housing 2, wherein the printed circuit board parts are pressed well against the housing walls by a possibly provided wedge-shaped cross-sectional face, which may be provided in the two cross-sectional planes of the housing 2, with the result that good mechanical and also thermal contact is created, as a result of which, on the one hand, good thermal conductivity and, on the other hand, good vibration strength is provided as well.

Figure 5:
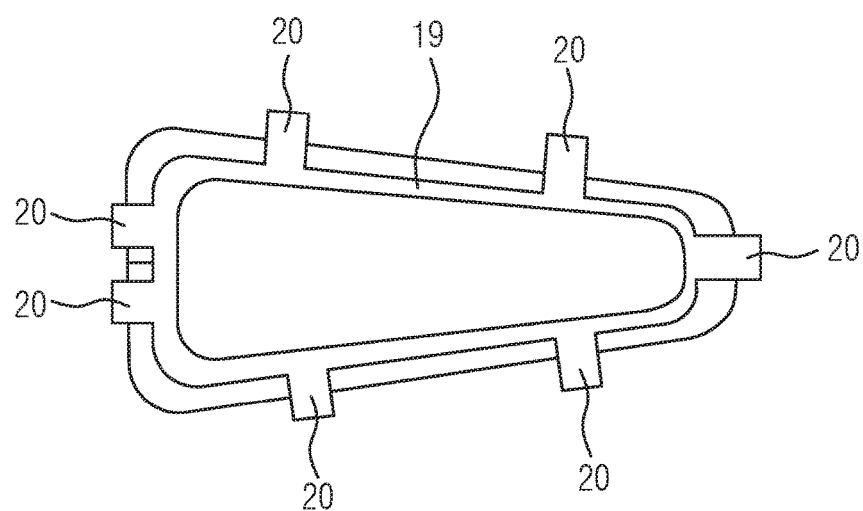
FIG. 5 shows a cross section of a support having latching lugs and a printed circuit board secured thereto support.

So that the printed circuit board 3 does not become detached again from the support 19 on account of the restoring forces of the flexible regions 10-13, holding elements, for example in the form of latching lugs 20, as are indicated in FIG. 5, are provided. Of course, any other form of fixing the printed circuit board to the support is also possible.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

The invention claimed is:

1. An electronic device, comprising:
a multi-part printed circuit board, including current-carrying, flexible regions and printed circuit board parts which are connected to one another by the current-carrying, flexible regions,
a support around which the printed circuit board, bent around the flexible regions of the printed circuit board, is arranged and fixed, and
a housing in which the printed circuit board mounted on the support is fixed,
wherein the printed circuit board has at least five printed circuit board parts, which are arranged in a row, wherein in the printed circuit board mounted on the support, the printed circuit board parts at row ends have a smaller width than a width of the entire printed circuit board, wherein a sum of widths of the printed circuit board parts at the row ends is not greater than the width of the entire printed circuit board, and the printed circuit board parts at the row end lie next to one another on the same side of the support.

2. The electronic device as claimed in claim 1, wherein the support includes latching lugs for fixing the printed circuit board, corresponding printed circuit board parts are latched in the latching lugs.

3. The electronic device as claimed in claim 1, wherein the printed circuit board parts at the row ends are fitted with contact plugs.

4. The electronic device as claimed in claim 1, wherein the support and an interior of the housing taper in at least a cross-sectional plane in a direction of the housing interior.

5. The electronic device as claimed in claim 1, wherein the housing has a cup shape.

6. The electronic device as claimed in claim 1, wherein the housing comprises a housing wall and the electronic device further comprises a thermally conductive compound arranged between the housing wall and a surface of a printed circuit board part of the printed circuit board parts that faces the housing wall.

7. The electronic device as claimed in claim 1, wherein opposed sides of the printed circuit board are populated with components.

8. The electronic device as claimed in claim 1, wherein the housing comprises a housing opening and a housing wall opposite the housing opening, the housing defines at least one cavity in which a component, arranged on the printed circuit board part facing the housing wall, is positioned.

9. The electronic device as claimed in claim 1, wherein the support is formed with bars which are connected to one another by respective corner connectors.

10. An electronic device, comprising:
a printed circuit board, including current-carrying, flexible regions and printed circuit board parts which are connected to one another by the current-carrying, flexible regions,
a support around which the printed circuit board is arranged and fixed, the printed circuit board parts being bent around the support via the flexible regions of the printed circuit board, and
a housing in which the printed circuit board, mounted on the support, is fixed,
wherein the printed circuit board has at least five printed circuit board parts arranged in a row, and with the printed circuit board mounted on the support, the printed circuit board parts at ends of the row have a smaller width than a width of the printed circuit board other than at the row ends, wherein a sum of widths of the printed circuit board parts at the row ends is not greater than the width of the printed circuit board other than at the row ends, and the printed circuit board parts at the row end are disposed next to each other on the same side of the support.

11. The electronic device as claimed in claim 10, wherein the support includes latching lugs fixing the printed circuit board to the support, and wherein corresponding printed circuit board parts are latched in the latching lugs.

12. The electronic device as claimed in claim 10, wherein the printed circuit board parts at the row ends include contact plugs.

13. The electronic device as claimed in claim 10, wherein the support and an interior of the housing each taper in at least a cross-sectional plane in a direction of the housing interior from an opening of the housing.

14. The electronic device as claimed in claim 10, wherein the housing comprises a housing wall and the electronic device further comprises a thermally conductive compound arranged between the housing wall and a surface of a printed circuit board part of the printed circuit board parts that faces the housing wall.

15. The electronic device as claimed in claim 10, wherein opposed sides of the printed circuit board are populated with components.

16. The electronic device as claimed in claim 15, wherein the housing defines a cavity in which the printed circuit board and the support are disposed, and at least one of the components disposed along a side of the printed circuit board facing a center of the cavity has a size which is greater than a space between an outer surface of the printed circuit board and an inner surface of the housing.

17. The electronic device as claimed in claim 10, wherein the housing comprises a housing opening and a housing wall opposite the housing opening, and the housing defines at least one cavity in which a component, arranged on the printed circuit board part facing the housing wall, is positioned.

18. An electronic device, comprising:
a printed circuit board, including current-carrying, flexible regions and printed circuit board parts which are connected to one another by the current-carrying, flexible regions,
a support around which the printed circuit board is arranged and fixed, the printed circuit board parts being bent around the support via the flexible regions of the printed circuit board, and
a housing in which the printed circuit board, mounted on the support, is fixed,
wherein opposed sides of the printed circuit board are populated with components, and
wherein the housing defines a cavity in which the printed circuit board and the support are disposed, and at least one of the components disposed along a side of the printed circuit board facing a center of the cavity has a size which is greater than a space between an outer surface of the printed circuit board and an inner surface of the housing.

* * * * *